(12) United States Patent
Wu

(10) Patent No.: US 7,718,491 B2
(45) Date of Patent: May 18, 2010

(54) METHOD FOR MAKING A NAND MEMORY DEVICE WITH INVERSION BIT LINES

(75) Inventor: Chao-I Wu, Tainan (TW)

(73) Assignee: Macronix International Co., Ltd. (TW)

( * ) Notice: Subject to any disclaimer, the term of this patent is extended or adjusted under 35 U.S.C. 154(b) by 817 days.

(21) Appl. No.: 11/424,789

(22) Filed: Jun. 16, 2006

(65) Prior Publication Data

US 2007/0290251 A1  Dec. 20, 2007

(51) Int. Cl.
*H01L 21/8247* (2006.01)
(52) U.S. Cl. ............... 438/261; 257/324; 257/E21.681; 365/184
(58) Field of Classification Search .................. 257/324, 257/E21.681; 438/261; 365/184
See application file for complete search history.

(56) References Cited

U.S. PATENT DOCUMENTS

| 6,295,227 | B1 | 9/2001 | Sakui et al. | |
|---|---|---|---|---|
| 6,878,988 | B1 * | 4/2005 | Lee et al. | 257/324 |
| 6,936,885 | B2 | 8/2005 | Shin et al. | |
| 7,061,046 | B2 * | 6/2006 | Willer et al. | 257/324 |
| 7,151,293 | B1 * | 12/2006 | Shiraiwa et al. | 257/314 |
| 7,348,625 | B2 * | 3/2008 | Liu et al. | 257/315 |
| 2006/0186455 | A1 * | 8/2006 | Chen et al. | 257/315 |

OTHER PUBLICATIONS

Yong-Sik Yim, et al., 70nm NAND Flash Technology with 0.025um2 Cell Size for 4Gb Flash Memory, 2003 IEEE.

* cited by examiner

*Primary Examiner*—Steven J Fulk
(74) *Attorney, Agent, or Firm*—Baker & McKenzie LLP

(57) ABSTRACT

A NAND based memory device uses inversion bit lines in order to eliminate the need for implanted bit lines. As a result, the cell size can be reduced, which can provide greater densities in smaller packaging. In another aspect, a method for fabricating a NAND based memory device that uses inversion bit lines is disclosed.

11 Claims, 12 Drawing Sheets

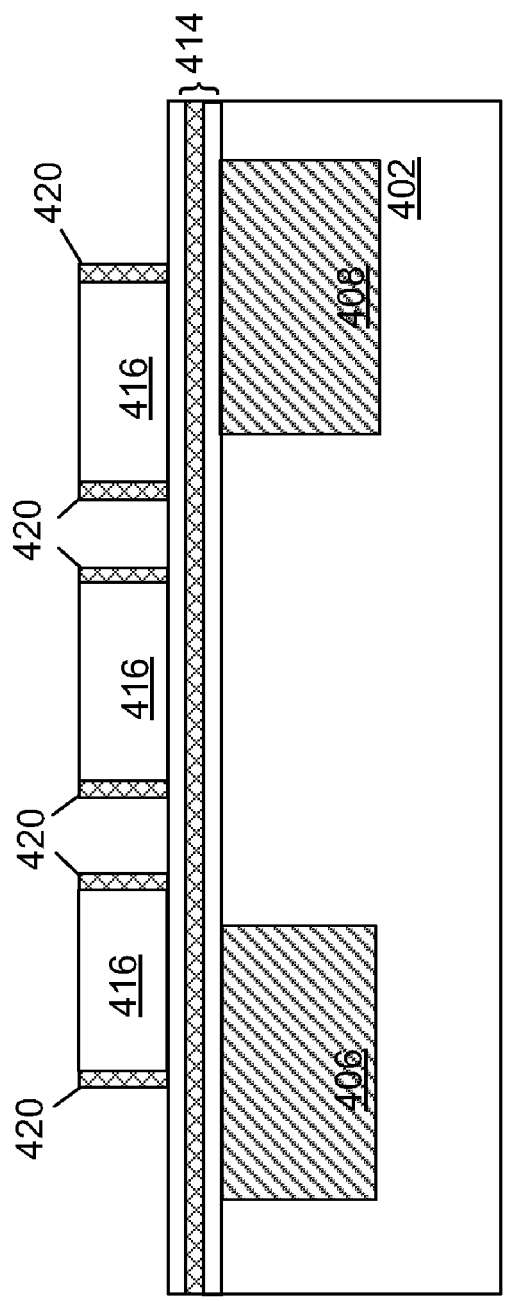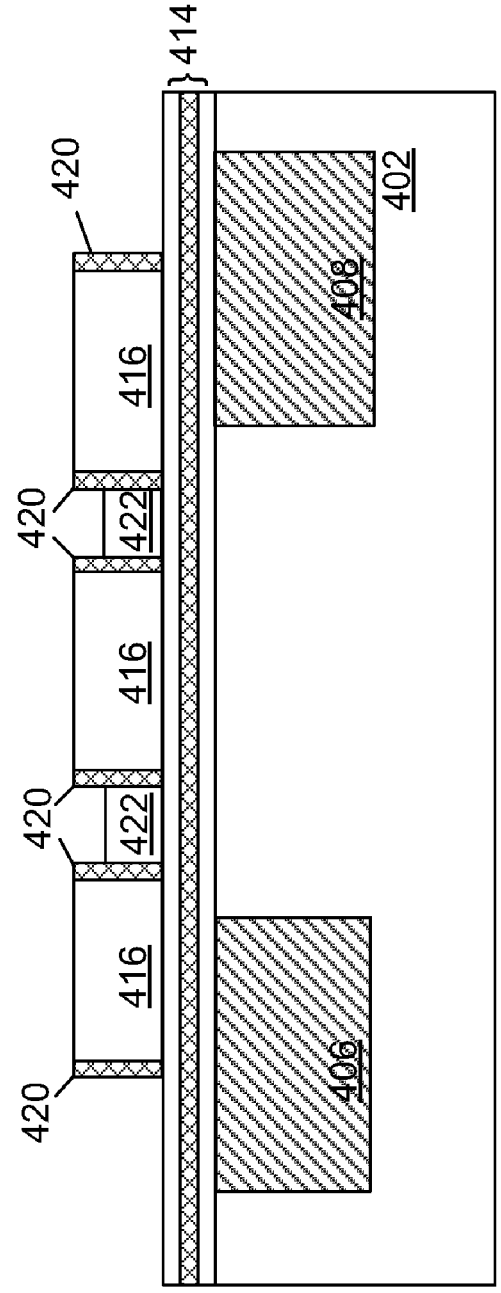

METHOD FOR MAKING A NAND MEMORY DEVICE WITH INVERSION BIT LINES

BACKGROUND

1. Field of the Invention

The embodiments described herein are directed to NAND memory devices, and more particularly to methods for fabricating smaller, higher density NAND memory devices.

2. Background of the Invention

NAND based flash memory has made possible a variety of new applications and storage capability. For example, NAND based memory was integral to removable media formats such as smart media, MMC, secured digital, memory sticks, and xD-picture cards. More recently, NAND based memory devices have been used for USB flash drives, MP3 players, digital cameras, and mobile phones, to name just a few newer applications. These new applications, however, constantly require smaller, higher density memory devices.

While multi level charge (MLC) techniques can be used to increase density and/or shrink the overall size of a NAND based memory device, the ability to use smaller, higher density devices is also dependent on the physical size constraints of each cell in the memory device. For example, one limitation on the cell size for conventional NAND based memory devices is the need for implanted bit lines in the memory array.

The inclusion of the implanted bit lines requires a certain area for each cell. If the need for the implanted bit lines is eliminated then the cell size can be reduced; however, conventional NAND based memory devices require the implanted bit lines. Accordingly, the reduction in size of conventional NAND based memory devices is limited.

SUMMARY

A NAND based memory device uses inversion bit lines in order to eliminate the need for implanted bit lines. As a result, the cell size can be reduced, which can provide greater densities in smaller packaging.

In another aspect, a method for fabricating a NAND based memory device that uses inversion bit lines is disclosed.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 4A-4G are diagrams illustrating an example process for fabricating a NAND based memory device in accordance with one embodiment.

DETAILED DESCRIPTION

Figure 1:
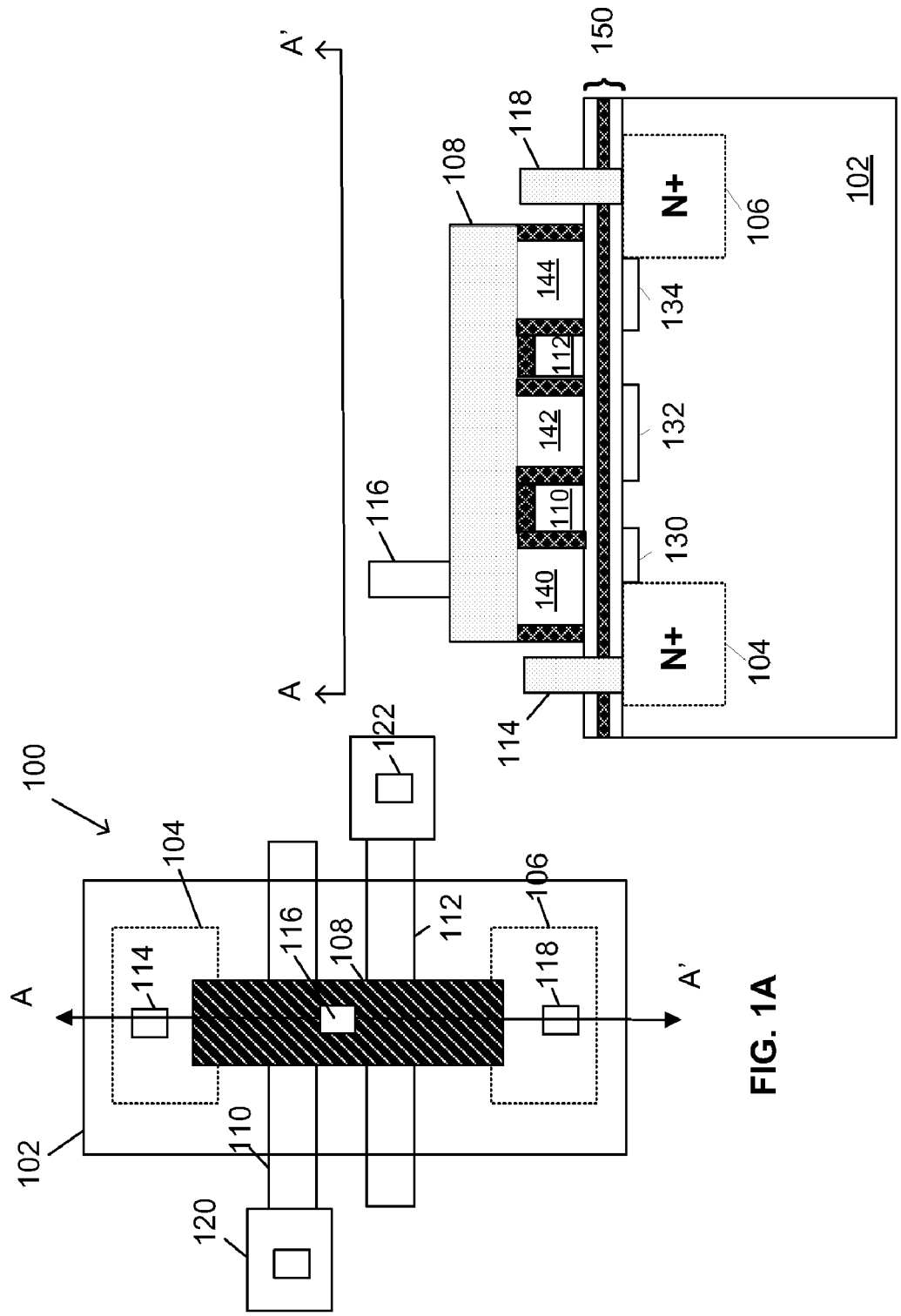
FIG. 1A is a diagram illustrating a top view of a NAND based memory device configured in accordance with one embodiment.
FIG. 1B is a diagram illustrating a cross section of the device illustrated in FIG. 1A.

FIG. 1A is a diagram illustrating an example of NAND memory device configured in accordance with one embodiment. As can be seen, device 100 is formed on a substrate 102 and comprises implanted diffusion regions 104 and 106. In the example of FIG. 1A, diffusion regions 104 and 106 are N+ implantation regions and substrate 102 is a P-type silicon substrate. It will be understood, however, that in other embodiments substrate 102 can be a N type substrate and diffusion regions 104 and 106 can be P+ type implantation regions. Diffusion regions 104 and 106 can act as the source and drain for device 102 as discussed below.

Device 100 also comprises wordlines 110 and 112 formed on top of substrate 102. A bit line 108 is then formed over and perpendicular to wordlines 110 and 112. Device 100 also includes several contacts configured to contact various portions of device 100. For example, device 100 includes contact 114 configured to contact implantation region 104, contact 118 configured to contact implantation region 106, contact 120 configured to contact wordline 110, contact 122 configured to contact wordline 112, and contact 116 configured to contact bit line 108.

FIG. 1B is a diagram illustrating a cross section along the line AA' of device 100. As can be seen in FIG. 1B, diffusion regions 104 and 106 are formed in substrate 102. A dielectric layer 150 is then formed over substrate 102. In one example embodiment, dielectric layer 150 comprises an oxide-nitride-oxide (ONO) layer. Accordingly, dielectric layer 150 can comprise, e.g., a SiN layer sandwich between two oxide layers.

As can be seen, contacts 114 and 118 extend through dielectric layer 150 until they contact diffusion regions 104 and 106. Wordlines 110 and 112 are then formed over dielectric layer 150 as illustrated. Polysilicon regions 140, 142, and 144 are then also formed on dielectric layer 150. Bit line 108 is then formed over, and is in contact with polysilicon regions 140, 142, and 144. Contact 116 is then formed so as to contact bit line 108.

When the appropriate voltage is applied to bit line 108 via contact 116, it will be coupled with polysilicon regions 140, 142, and 144 and will create inversion bit line 130, 132 and 134 in the top layer of substrate 102. These inversion bit lines 130, 132, 134 can be used to conduct the source and drain voltages.

Figure 2:
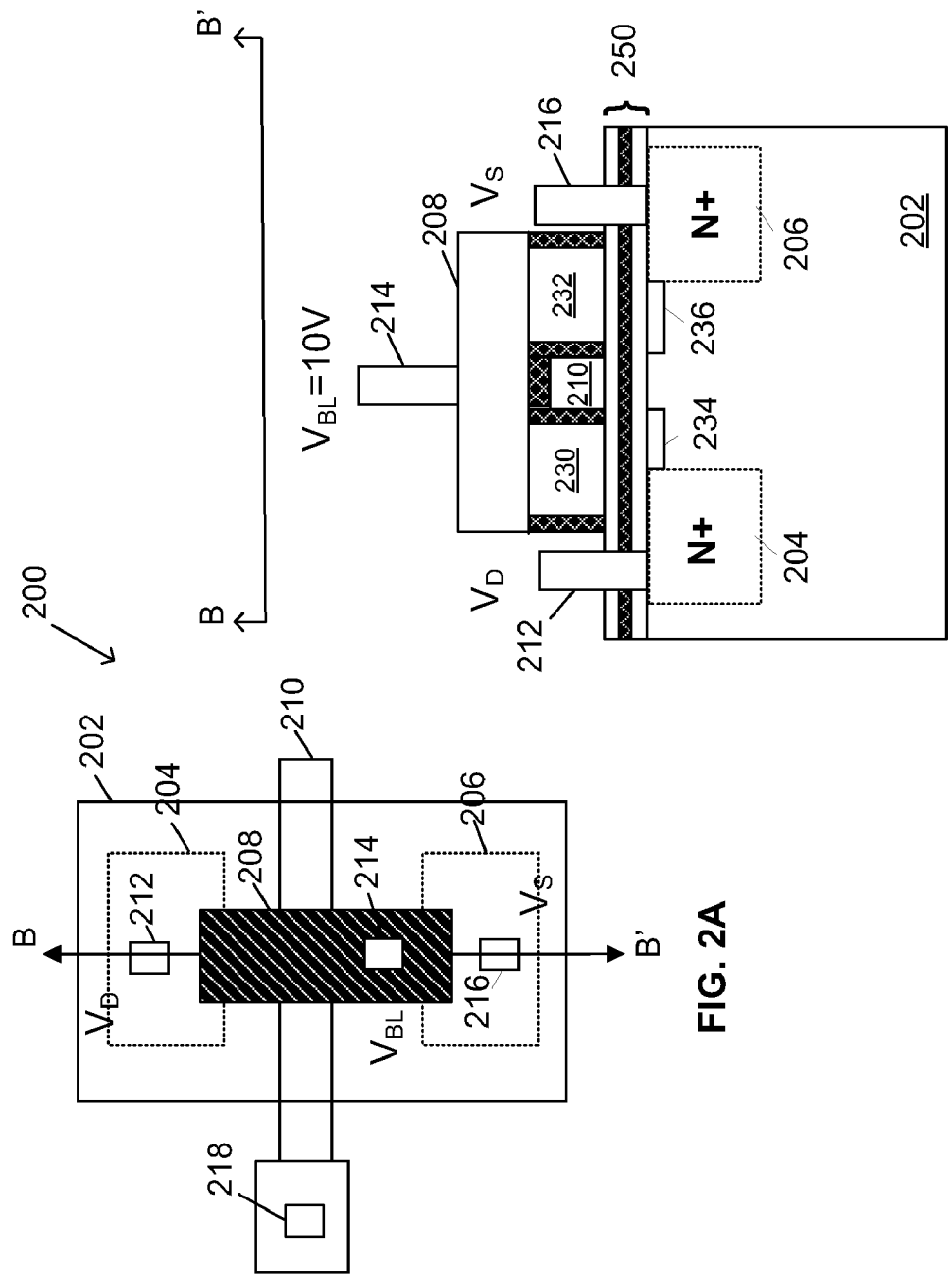
FIG. 2A is a diagram illustrating the top view of a NAND based memory device that includes a single wordline and is configured in accordance with one embodiment.
FIG. 2B is a diagram illustrating a cross section of the device illustrated in FIG. 2A.

FIGS. 2A and 2B illustrate a NAND memory device 200 that comprises a single wordline 210 in accordance with one embodiment. FIGS. 2A and 2B can be used to illustrate the operation of a NAND memory device comprising inversion bit lines as described herein. It will be understood, that the principles described in relation to FIGS. 2A and 2B can also be applied to a NAND memory device comprising multiple wordlines such as NAND memory device 100 illustrated in FIGS. 1A and 1B.

Accordingly, device 200 comprises a substrate 202 with N+ diffusion regions 204 and 206 implanted therein. Contacts 212 and 216 are formed so as to contact implantation regions 204 and 206. Wordline 210 is formed on substrate 202 in the x direction, while bit line 208 is formed over wordline 210 in the y direction. Contact 218 is constructed so as to contact wordline 210 and contact 214 is constructed so as to contact bit line 208.

FIG. 2B is a diagram illustrating a cross section of device 200 along the line BB'. Diffusion regions 204 and 206 are formed in substrate 202. A dielectric layer 250 is then formed on top of substrate 202 and contacts 212 and 216 are formed so that they extend down to dielectric layer 250 until they contact implantation regions 204 and 206. Wordline 210 is then formed on dielectric layer 250 as illustrated, and bit line 208 is formed over wordline 210.

Polysilicon regions 230 and 232 are formed on dielectric layer 250 and in contact with bit line 208. This way, voltages applied to bit line 208 via contact 214 can be used to create inversion bit lines 234 and 236. It will be understood, that a sufficient voltage must be applied to bit line 208 in order to form inversion regions 234 and 236. For example, a bit line voltage of approximately 10 volts can be used to create inversion bit lines 234 and 236. Inversion bit lines 234 and 236 can then be used to conduct the source and drain voltages.

A voltage can be applied to wordline 210 in order to form a channel between implantation regions 204 and 206 in the upper layer of substrate 202. Contacts 212 and 216 can then be used to apply voltages sufficient to create a high lateral electric field between implantation regions 204 and 206 which will cause carriers to migrate through the channel formed in substrate 202.

Figure 3:
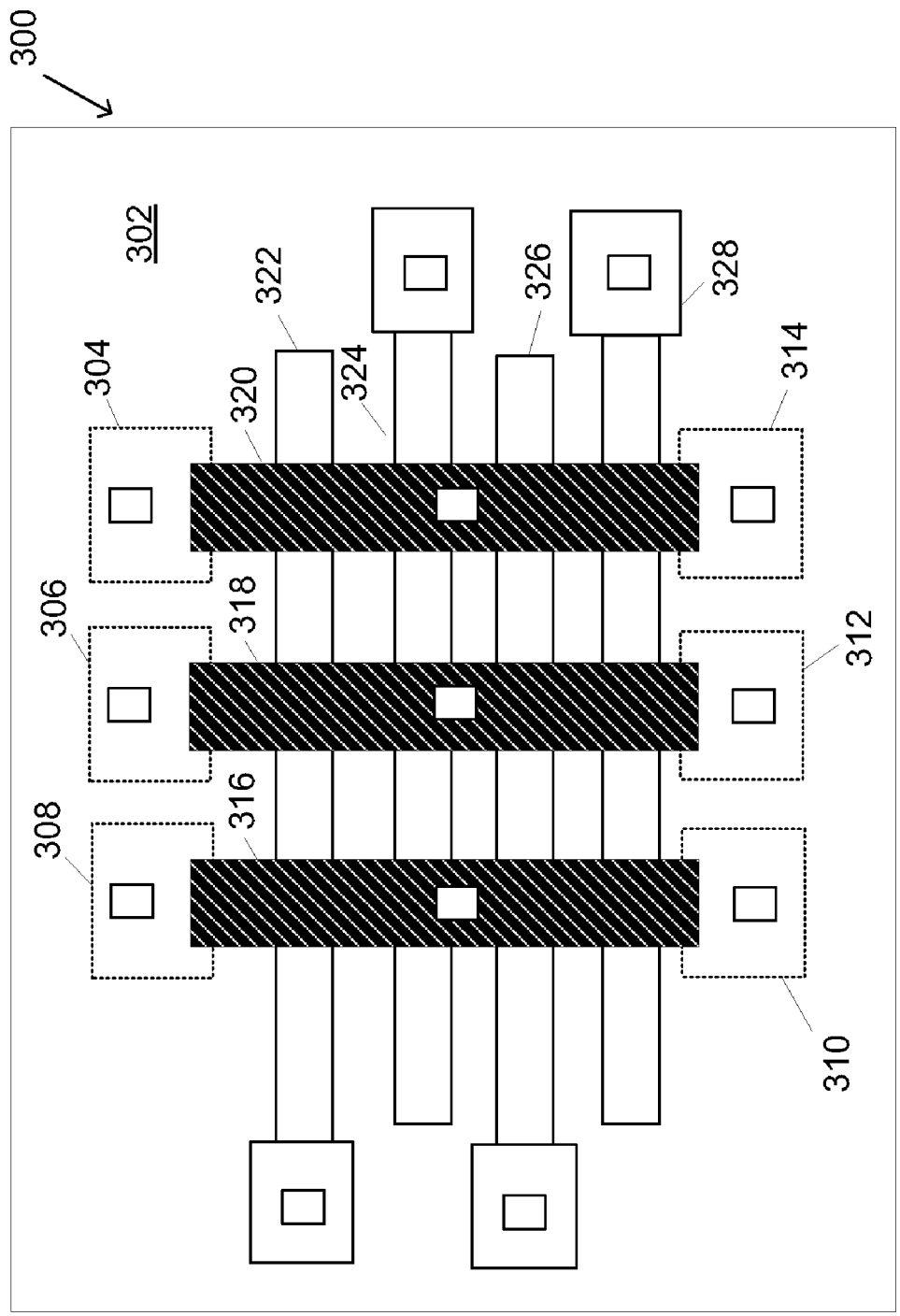
FIG. 3 is a diagram illustrating an array architecture for a NAND based memory device configured in accordance with one embodiment.

FIG. 3 is a diagram illustrating an array architecture for a NAND memory device configured in accordance with one embodiment. Accordingly, array 300 illustrated in FIG. 3 comprises a substrate 302 with implantation regions 304, 306, 308, 310, 312, and 314 implanted therein. Implantation regions 304, 306, and 308 connect as drain regions for the array, while implantation regions 310, 312, and 314 can act as source regions for the array. The array also comprises three bit lines 316, 318, and 320 and four wordlines 322, 324, 326, and 328. Each drain and source pair, and the associated word and bit lines, acts as a memory cell in the array. Source and drain voltages can be conducted via inversion bit lines for each cell as described above, e.g., in relation to FIG. 2. Because of the omission of implanted bit lines, and the use of inversion bit lines, array 300 can be made smaller, which can lead to a reduction in package size and/or an increase in density.

Figure 3A:
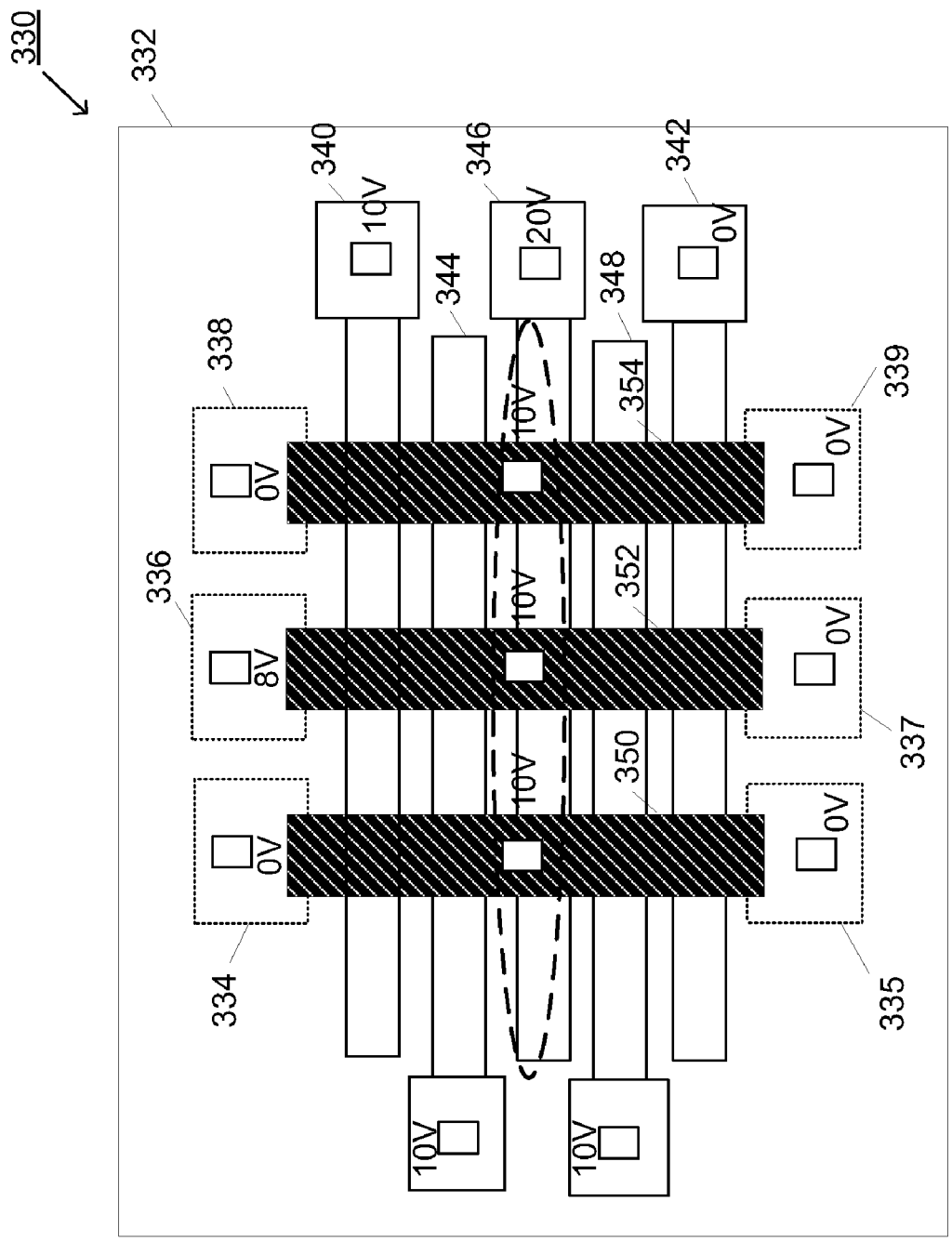
FIGS. 3A-3C are diagrams illustrating example methods for operating the array of figures.
Figure 3B:
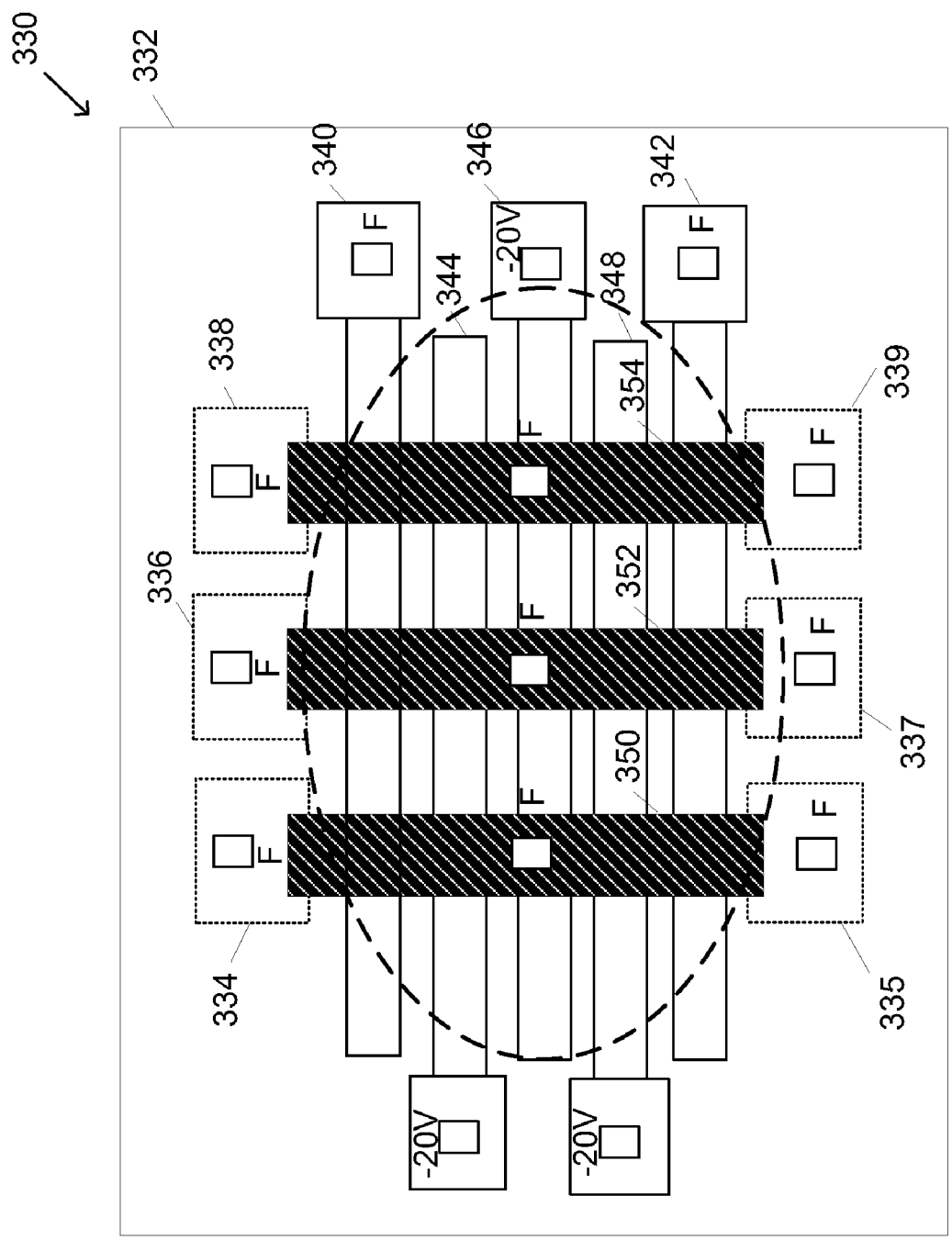
Figure 3C:
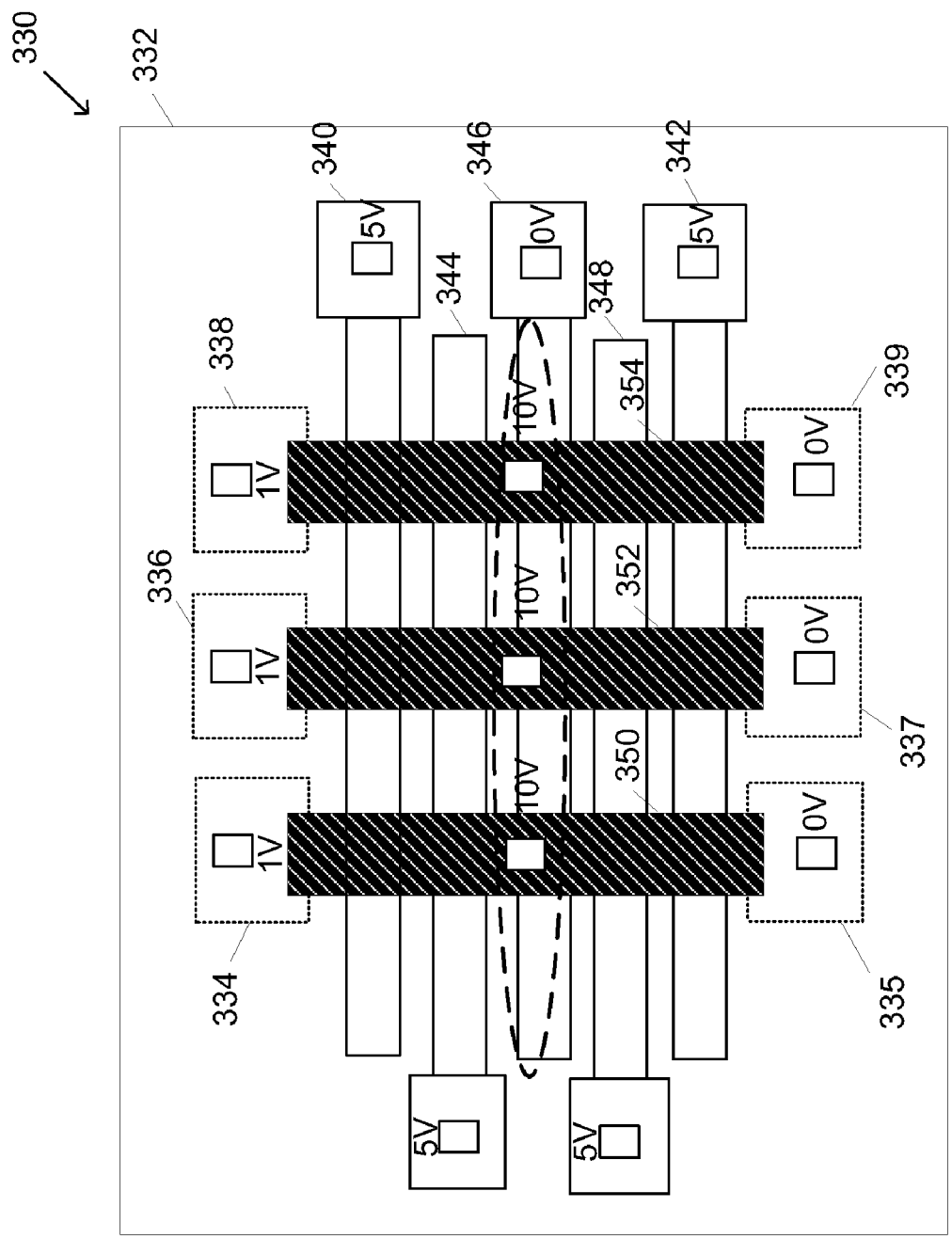

FIGS. 3A-3C are diagrams illustrating the operations for a NAND array configured in accordance with certain embodiments described herein. It will be understood, that the operations described in relations to FIGS. 3A-3C illustrate examples operations that can be performed with the NAND architecture described above. It would be understood, that given the architecture described above, many different types of memory operations are possible. Accordingly, the embodiments described herein should not be seen as limited to the operations described in relation to FIGS. 3A-3C.

FIG. 3A is a diagram illustrating an example method for programming bits in array 330. The operation illustrated in FIG. 3 uses Fowler-Nordhein tunneling to store charge in the gate of a selected cell. The stored charge changes the threshold voltage for the cell and thus changes the programming of the cell.

FIG. 3A illustrates a page programming operation where word line 346 is the selected word line. A high-voltage, e.g., in the approximate range of +16 to +24 volts, can be applied to selected word line 346. In the specific example of FIG. 3A, a high voltage of approximately +20 volts is applied to selected word line 346. A high voltage, e.g., in the range of approximately +8 to +12 volts, can be applied to unselected word lines 344 and 348. In the specific example of FIG. 3A, high voltages of approximately +10 volts are applied to word lines 344 and 348. In addition, select gates 340 and 342 are included in array 330. A high voltage, e.g., in the range of approximately +8 to +12 volts can be applied to the top select gate 340, while a low voltage of approximately 0 volts can be applied to the bottom select gate 342. In the specific example of FIG. 3A, a high voltage of approximately +10 volts is applied top select gate 340.

Diffusion regions 334, 336, and 338 can acts as drain diffusion regions for the page programming operation illustrated in FIG. 3A. Diffusion regions 335, 337, and 339 can act as source diffusion regions. A high voltage, e.g., in the range of +6 to +10 volts can be applied to drain diffusion region 336, while 0 volts can be applied to the remaining drain and source diffusion regions. In the specific example of FIG. 3A, a high voltage of approximately +8 volts can be applied to drain diffusion region 336.

A high voltage can be applied to bit lines 350, 352, and 354, in order to produce the inversion bit lines in the upper layer of substrate 332. Again, as explained above, the inversion bit lines can conduct the source and drain voltages needed to program the selected cells in array 330. In the example of FIG. 3A, a bit line voltage of approximately +10 volts is applied to bit lines 350, 352, and 354.

It will be understood, however, that the voltages illustrated in FIG. 3A are by way of example only and that the actual voltages used will depend on the requirements of a specific implementation.

FIG. 3B is a diagram illustrating a sector erase for array 330 in accordance with one embodiment. Again, Fowler-Nordhein tunneling can be used to erase selected cells in array 330. Here, large negative voltages, e.g., in the range of approximately −16 to −24 volts are applied to word lines 344, 346 and 348. In the specific example, FIG. 3B, a large negative voltage of approximately −20 volts is applied to word lines 344, 346, and 348. Top and bottom select gates, 340 and 342 are allowed to float as are the drain and source diffusion regions and each of the bit lines 350, 352, and 354.

It will be understood, however, that the voltages illustrated in FIG. 3B are by way of example only and that the actual voltages used will depend on the requirements of a specific implementation.

FIG. 3C is a diagram illustrating a page read operation for array 330 in accordance with one embodiment. In the example of FIG. 3, word line 346 is the selected word line. A low voltage of approximately 0 volt is applied to word line 346, while high voltages, e.g., in the range of approximately +3 to +7 volts are applied to unselected word lines 344 and 348 as well as to top and bottom select gates 340 and 342. The drain diffusion regions 334, 336, and 338 can be tied to approximately +1 volt, while source diffusions regions 335, 337, and 339 are tied to 0 volts. In the specific example of FIG. 3C, a high voltage of approximately +5 volts is applied to word lines 344 and 348 as well as select gates 340 and 342.

It will be understood, however, that the voltages illustrated in FIG. 3C are by way of example only and that the actual voltages used will depend on the requirements of a specific implementation.

Figure 4A:
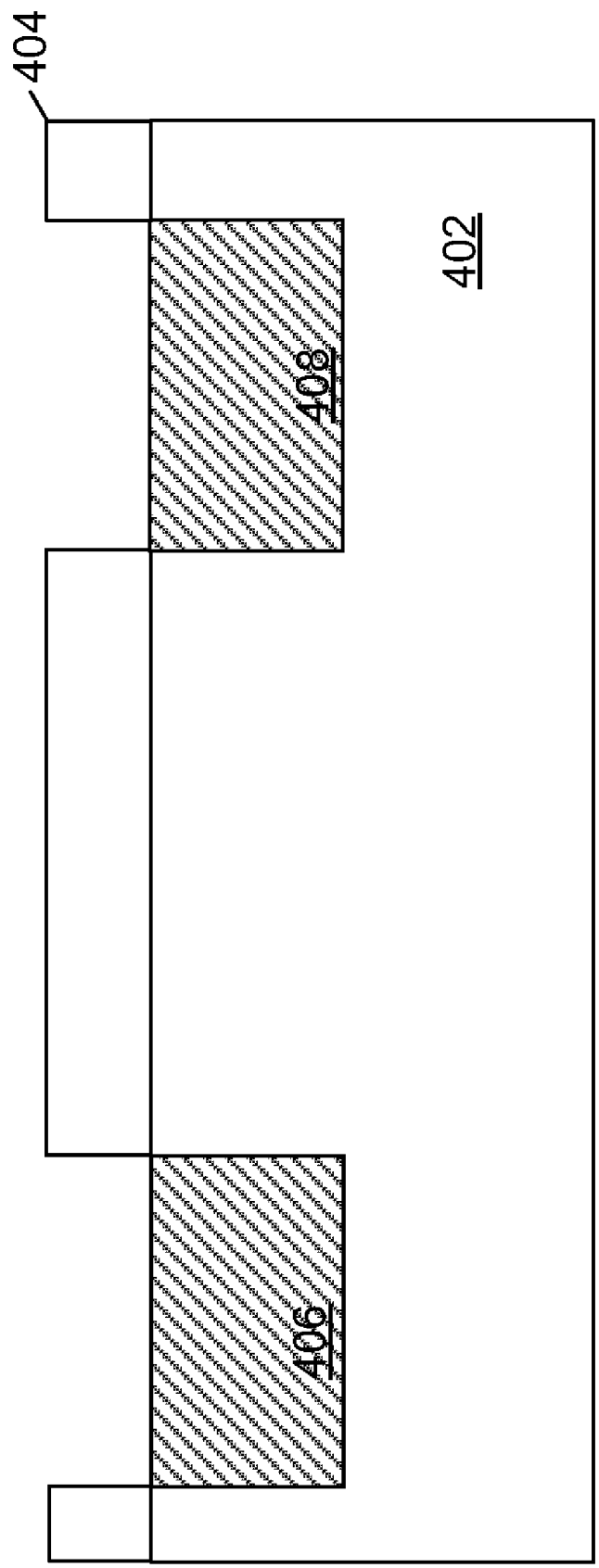

FIGS. 4A-4G can be used to illustrate an example process for fabricating a NAND memory device that uses inversion bit lines in accordance with one embodiment. As illustrated in FIG. 4A, the process can start with formation of a substrate 402. A photoresist layer 404 can then be formed on top of substrate 402 in order to define implantation regions 406 and 408. After photoresist 404 is formed on top of substrate 402, implantation regions 406 and 408 can be formed and photoresist layer 404 can be removed.

In the example of FIG. 4A, substrate 402 is a P-type substrate and implantation regions 406 and 408 are N+ implantation regions. It will be understood, however, that another embodiment substrate 402 can be an N-type substrate and implantation regions 406 and 408 can be P+ implantation regions.

It will understood, that implantation regions 406 and 408 are formed by accelerating ions at high energy onto substrate 402, where they will be driven into substrate 402 and become embedded in the areas left unprotected by the photoresist layer. In certain embodiments, an annealing step can be used to heal any damage that result from the ion implantation.

Figure 4B:
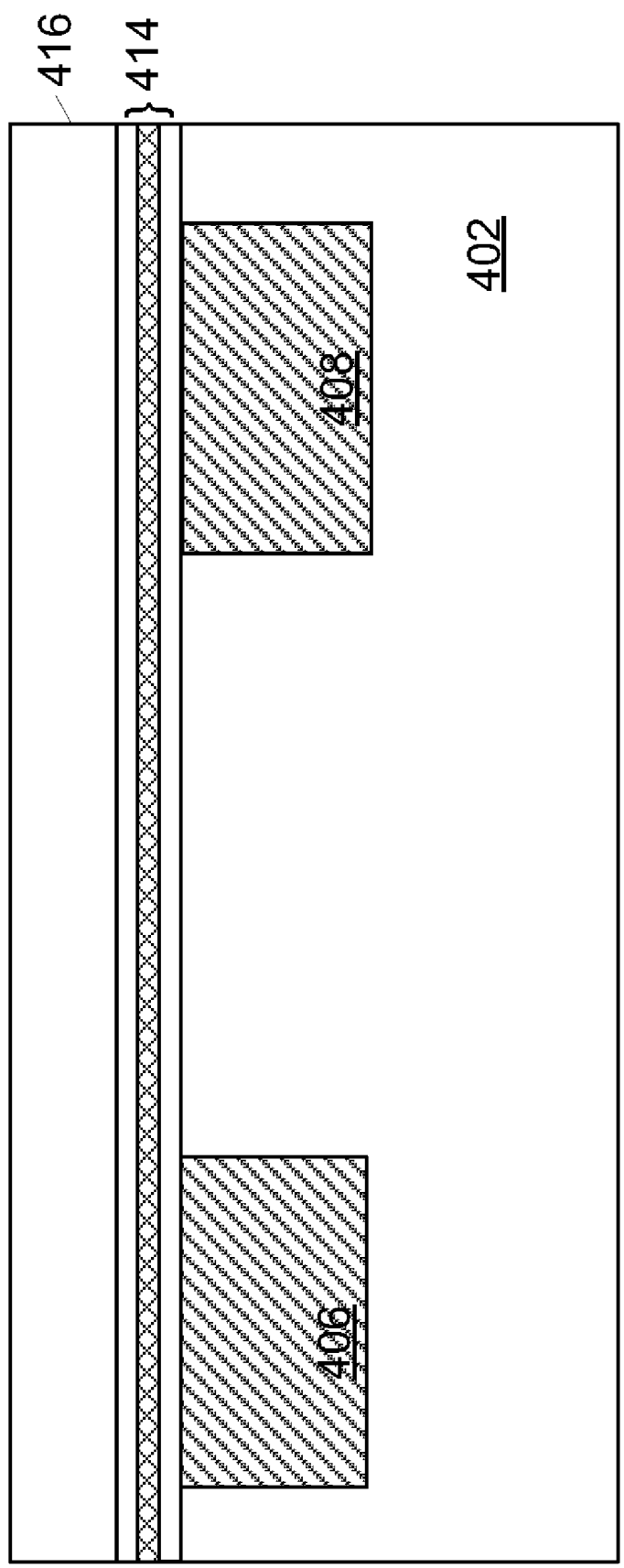

As illustrated in FIG. 4B, a dielectric layer 414 can then be formed over substrate 402. In the example of FIG. 4B, dielectric layer 414 is an ONO layer. Accordingly, formation of dielectric layer 414 comprises depositing an oxide layer, a nitride layer, such as a SiN layer, and another oxide layer. Layer 414 can be formed, for example, using Chemical Vapor Deposition (CVD).

After formation of dielectric layer 414, a polysilicon layer 416 can be formed over dielectric layer 414. For example, an N-type polysilicon layer 416 can be deposited on top of dielectric layer 414.

Figure 4C:
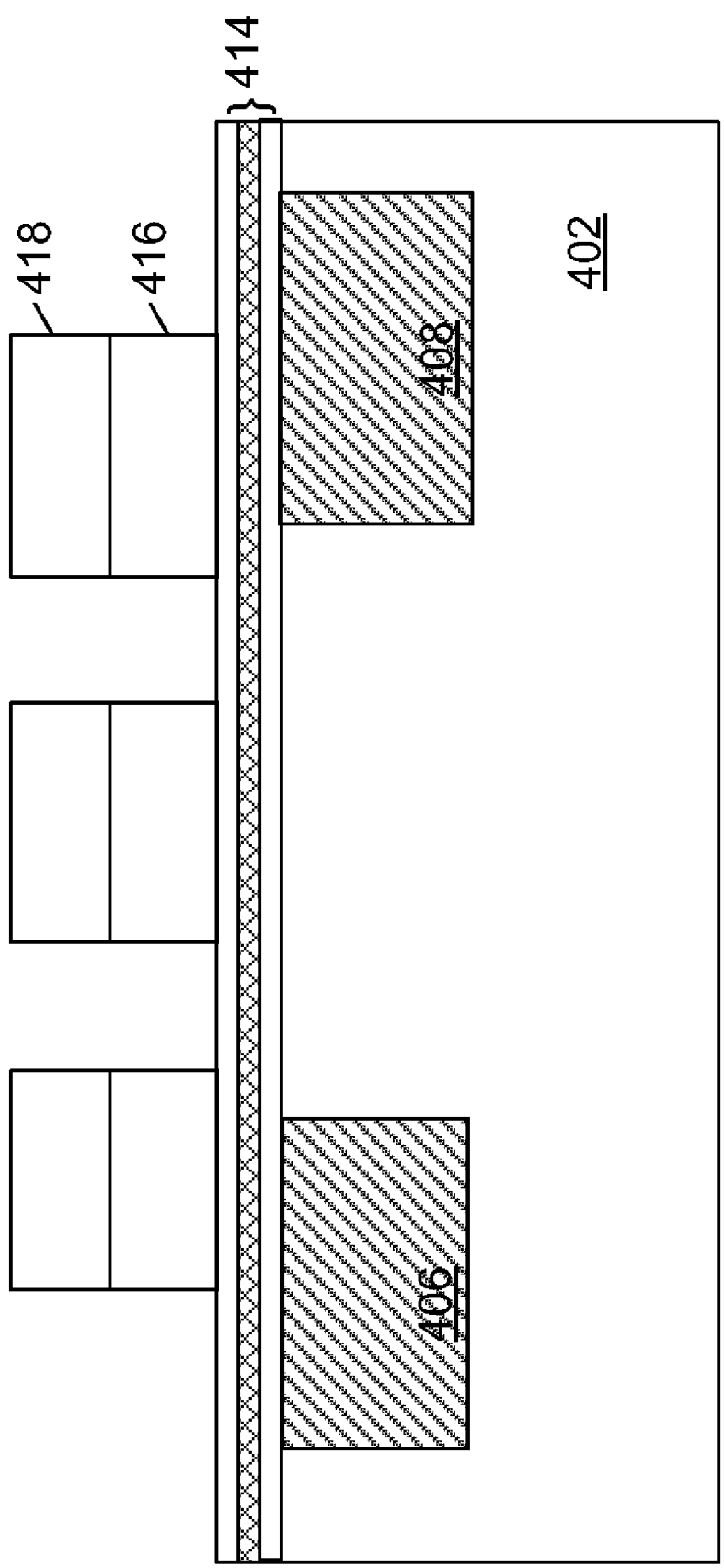

As illustrated in FIG. 4C, a photo resist layer 418 can be formed over polysilicon layer 416 in order to define polysilicon layer 416. An etching process can then be used to etch polysilicon layer 416 and photoresist layer 418 can be removed.

As illustrated in FIG. 4D, alter the photoresist layer is removed, oxide spacer 420 can be formed next to the regions of polysilicon layer 416 formed by the etching process. Polysilicon spacers 422 can then be formed in between the regions of polysilicon layer 416 as illustrated in FIG. 4E.

Figure 4F:
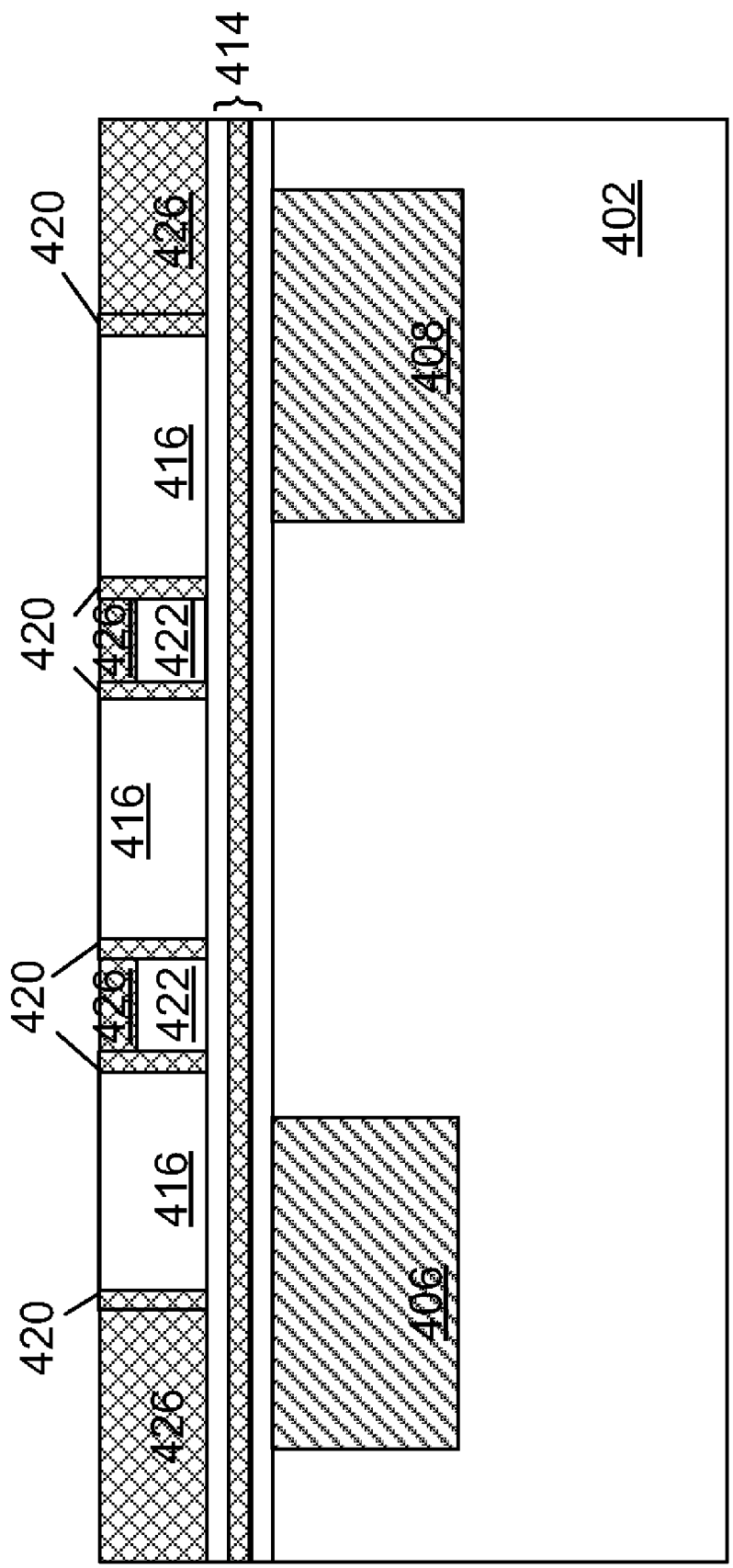

Oxide regions 426 can then be formed, e.g., using High Density Plasma (HDP) techniques as illustrated in FIG. 4F. The top layer of the structure formed thus far can then be planarized to produce a plainer surface. For example, an etch back process or chemical-mechanic-polish can be used to planarize the upper layers of the structure illustrated in FIG. 4F.

Figure 4G:
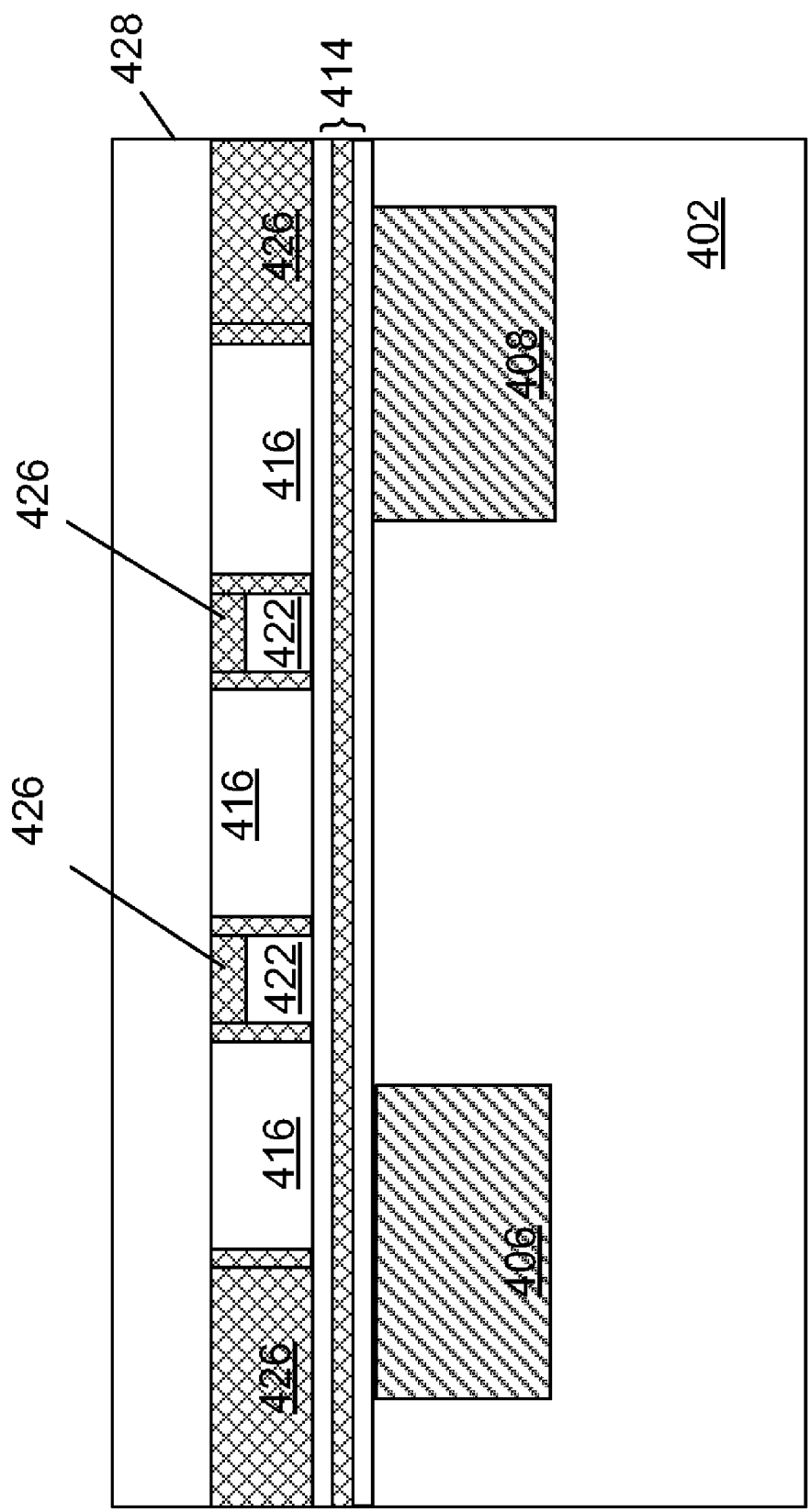

As illustrated in FIG. 4G, a polysilicon layer 428 can then be formed, e.g., deposited, over and in contact with polysilicon regions 416 as illustrated. Polysilicon layer 428 can then be defined, e.g., via photoresist, and etched in order to form the required bit lines.

Thus, polysilicon layer 428 can be used to form the bit lines, polysilicon layer 416 can be used to define the regions under bit line 428 that are needed to form the inversion bit lines described above. And polysilicon regions 422 and 424 can form the wordlines for the device.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating a memory device that uses inversion bit lines, the method comprising:
   forming a first and a second diffusion region in a substrate;
   forming a dielectric layer over the substrate;
   forming a polysilicon layer over the dielectric layer;
   etching the polysilicon layer to form polysilicon regions and trenches that define wordline regions;
   forming wordlines in the regions defined by the trenches by forming polysilicon layers in the trenches; and
   forming a bit line in contact with the polysilicon regions formed by the etching.

2. The method of claim 1, wherein forming the dielectric layer comprises forming an ONO structure on the substrate.

3. The method of claim 1, wherein forming the bit line comprises forming a second polysilicon layer over the first polysilicon layer and etching the second polysilicon layer.

4. The method of claim 1, wherein the bit line is formed over the word line.

5. The method of claim 1, wherein the substrate is a P type substrate and the diffusion regions are N type implantation regions.

6. The method of claim 1, wherein the substrate is a N type substrate and the diffusion regions are P type implantation regions.

7. A method for fabricating a memory device that uses inversion bit lines, the method comprising:
   forming a first and a second diffusion region in a substrate;
   forming a dielectric layer over the substrate;
   forming a polysilicon layer over the dielectric layer;
   etching the polysilicon layer to form polysilicon regions and trenches that define wordline regions, wherein the dielectric layer remains continuous after the etching of the polysilicon layer;
   forming polysilicon layers in the trenches to form wordlines; and
   forming a bit line in contact with the polysilicon regions formed by the etching.

8. The method of claim 7, wherein forming the dielectric layer comprises forming an ONO structure on the substrate.

9. The method of claim 7, wherein forming the bit line comprises forming a second polysilicon layer over the first polysilicon layer and etching the second polysilicon layer.

10. The method of claim 7, wherein the bit line is formed over the word line.

11. The method of claim 7, wherein the substrate is a P type substrate and the diffusion regions are N type implantation regions.

* * * * *